(12) United States Patent
Suh

(10) Patent No.: US 7,692,231 B2
(45) Date of Patent: Apr. 6, 2010

(54) SEMICONDUCTOR DEVICE AND METHOD OF FABRICATING THE SAME

(75) Inventor: Jai Bum Suh, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/966,466

(22) Filed: Dec. 28, 2007

(65) Prior Publication Data

US 2009/0108340 A1    Apr. 30, 2009

(30) Foreign Application Priority Data

Oct. 30, 2007    (KR) .................... 10-2007-0109839

(51) Int. Cl.
*H01L 29/732* (2006.01)
(52) U.S. Cl. ............... 257/296; 257/300; 257/302; 257/E27.096; 257/E21.646; 438/268
(58) Field of Classification Search ............ 257/296, 257/300, 302, 328, 401, E27.96, E29.267, 257/E21.646, 329, E27.096, E21.616, E21.647, 257/E21.649, E21.652, E21.659, 68, 71, 257/308; 438/212, 268, 283, 284, 397, 399
See application file for complete search history.

(56) References Cited

U.S. PATENT DOCUMENTS

2006/0043471 A1*  3/2006  Tang et al. ................. 257/328
2007/0012996 A1*  1/2007  Yoon et al. ................. 257/329
2007/0080385 A1   4/2007  Kim et al.
2007/0082448 A1*  4/2007  Kim et al. ................. 438/268
2007/0181925 A1   8/2007  Yoon et al.

FOREIGN PATENT DOCUMENTS

KR          100723527 B1      5/2007

* cited by examiner

*Primary Examiner*—Lynne A. Gurley
*Assistant Examiner*—Yosef Gebreyesus
(74) *Attorney, Agent, or Firm*—Townsend and Townsend and Crew LLP

(57) ABSTRACT

A method of fabricating a semiconductor device includes forming a mask pattern over a semiconductor substrate to define a channel region. A portion of the semiconductor substrate is etched using the mask pattern as an etching mask to form a first pillar. A spacer is formed over a sidewall of the mask pattern and the first pillar. A portion of the semiconductor substrate exposed between the first pillars is etched using the spacer and the mask pattern as an etching mask to form a second pillar elongated from the first pillar. A portion of the second pillar is selectively etched to form a third pillar. The spacer and the mask pattern are removed. An impurity is implanted into an upper part of the first pillar and the semiconductor substrate between the third pillars to form a source/drain region. A surrounding gate is formed over an outside of the third pillar.

18 Claims, 8 Drawing Sheets

(i)

(ii)

(i)           (ii)

(i)           (ii)

(i)           (ii)

(i)           (ii)

(i) (ii)

(i) (ii)

(i)                 (ii)

(i)                 (ii)

SEMICONDUCTOR DEVICE AND METHOD OF FABRICATING THE SAME

CROSS-REFERENCES TO RELATED APPLICATIONS

This application claims priority of Korean patent application number 10-2007-0109839, filed on Oct. 30, 2007, which is incorporated by reference in its entirety.

BACKGROUND OF THE INVENTION

The invention generally relates to a semiconductor device. More particularly, the invention relates to a semiconductor device having a vertical transistor and a method of fabricating the same.

Semiconductor devices such as Dynamic Random Access Memory (DRAM) are becoming more highly integrated. In order to form more transistors in a limited area, a vertical transistor for fabricating a memory cell device in a small area has been proposed. In memory devices, the vertical transistor includes a surrounding gate that surrounds a vertical channel of the gate.

In order to form the surrounding gate in a limited 4F2 area, a channel region is selectively isotropic-etched to make the channel region narrow compared with source/drain regions, thereby obtaining an excellent device characteristic. As a result, the vertical transistor can effectively utilize the limited area. The vertical transistor may be used in various applications requiring small transistors such as DRAM.

The vertical transistor maintains a channel length in spite of reduced device size to provide an effective means to overcome Short Channel Effects (SCE). For example, the surrounding gate can maximize gate controllability to provide an excellent device characteristic of driving current because the surrounding gate has a relatively large current flowing area as well as SCE. Therefore, there is a need for a vertical transistor having a thinner and longer structure.

However, when forming a gate of the vertical transistor with a high aspect ratio, particles may remain on a sidewall or a top surface of a pillar having a high aspect ratio. Since a junction region is formed by an ion implanting process after the gate is formed, there is an insufficient overlap margin between the gate and the junction region. As a result, the body of the vertical transistor is isolated from the semiconductor substrate, which causes a floating body effect.

It is difficult to etch a narrow and deep bit line separation due to the high aspect ratio. Because of the high aspect ratio, there is a possibility that the bit lines will not be separated from each other. It is also difficult to fill an insulating film for bit line separation due to the high aspect ratio. As a result of this phenomenon, the yield of devices might be reduced.

SUMMARY OF THE INVENTION

Embodiments of the present invention are directed to a semiconductor device including a vertical transistor. According to an embodiment of the invention, the semiconductor device includes forming a surrounding gate after a mask pattern is removed. The mask pattern defines a vertical transistor region. The etching process for bit line separation is performed to form the vertical transistor. Accordingly, the source/drain region is formed by one impurity ion implanting process, thereby simplifying the procedure. In addition, the yield of devices can be improved.

According to an embodiment of the present invention, a method of fabricating a semiconductor device comprises: forming a mask pattern over a semiconductor substrate to define a channel region. A portion of the semiconductor substrate is etched using the mask pattern as an etching mask to form a first pillar. A spacer is formed over a sidewall of the mask pattern and the first pillar. A portion of the semiconductor substrate exposed between the first pillars is etched using the spacer and the mask pattern as an etching mask to form a second pillar elongated from the first pillar. A portion of the second pillar is selectively etched to form a third pillar. The spacer and the mask pattern are removed. An impurity is implanted into an upper part of the first pillar and the semiconductor substrate between the third pillars to form a source/drain region. A surrounding gate is formed over an outside of the third pillar.

According to an embodiment of the present invention, a semiconductor device comprises a vertical transistor fabricated by the above described method.

DESCRIPTION OF EMBODIMENTS

The present invention relates to a semiconductor device including a vertical transistor. In one embodiment of the present invention, the semiconductor device includes forming a surrounding gate after a mask pattern is removed. The mask pattern defines a vertical transistor region. The etching process for bit line separation is then performed to form the vertical transistor.

Figure 1:
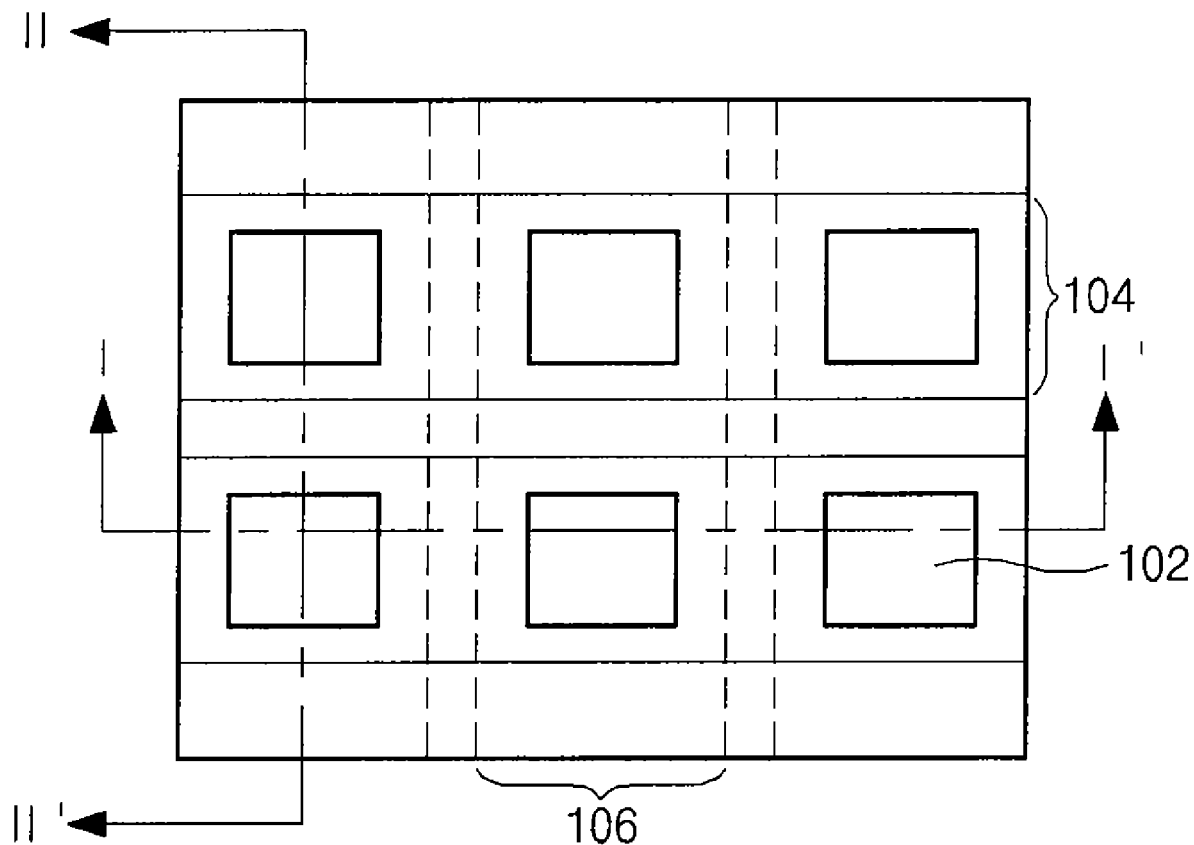
FIG. 1 is a layout of a semiconductor device according to an embodiment of the present invention.

FIG. 1 is a layout of a semiconductor device according to an embodiment of the present invention. A semiconductor device includes a channel region 102, a word line region 104, and a bit line region 106. Channel region 102 is vertically formed over a semiconductor substrate (not shown). Although the top surface of channel region 102 is formed to be rectangular in this embodiment of the present invention, it is not so limited.

Word line region 104 is extended toward one side over the semiconductor substrate so that word line region 104 is crossed with bit line region 104. A width of word line region 104 in a minor axis is greater than that of channel region 102 so that a word line substantially surrounds an outer surface of channel region 102. Word line region 104 is separated from neighboring word line region 104 by a space defined between two neighboring word line regions 104.

Bit line region 106 is extended toward the other side over the semiconductor substrate so that bit line region 106 is crossed with word line region 104. Bit line region 106 is separated from neighboring bit line region 106 by a space defined between two neighboring bit line regions 106.

Figure 2A:
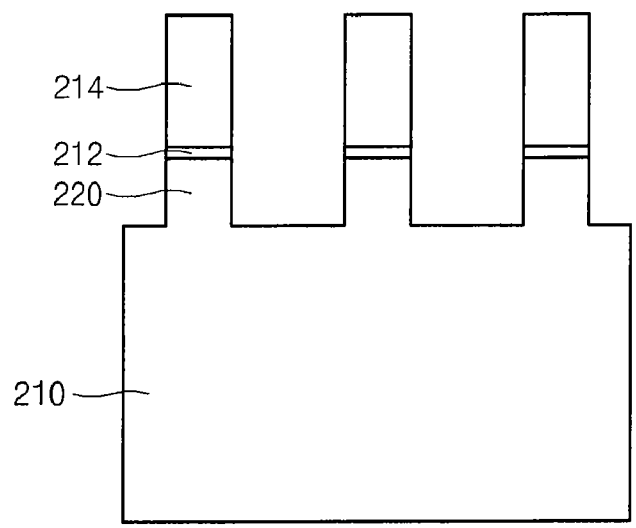
FIGS. 2a to 2m are cross-sectional views illustrating a method for fabricating a semiconductor device according to an embodiment of the present invention.
Figure 2A:
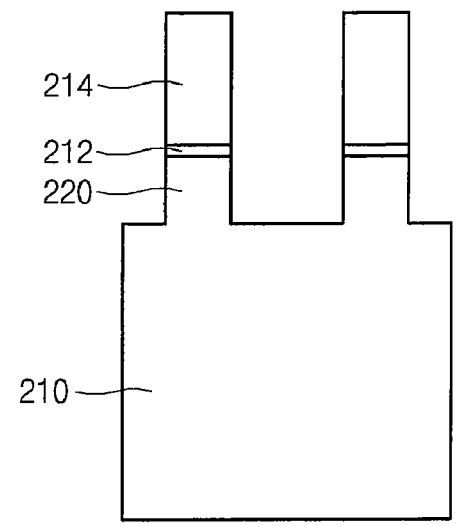

FIGS. 2a to 2m are cross-sectional views illustrating a method of fabricating a semiconductor device according to an embodiment of the present invention. FIGS. 2a(i) to 2m(i) are cross-sectional views taken along I-I' of FIG. 1, and FIGS. 2a(ii) to 2m(ii) are cross-sectional views taken along II-II' of FIG. 1. A pad insulating film 212 and mask layer (not shown) are formed over a semiconductor substrate 210. The mask layer is patterned using a mask that defines channel region 102 of FIG. 1, to form a mask pattern 214. Pad insulating film 212 may be an oxide film, a nitride film, or a combination thereof. The mask layer comprises a silicon nitride film. The top surface of mask pattern 214 may be formed to be circular or polygonal.

Pad insulating film 212 and a portion of semiconductor substrate 210 are etched using mask pattern 214 as an etching mask to form a plurality of first vertical pillars 220 that defines a channel region. Each first vertical pillar 220 serves a source/drain region. In DRAM, each first vertical pillar 220 is electrically connected with a capacitor.

Figure 2B:
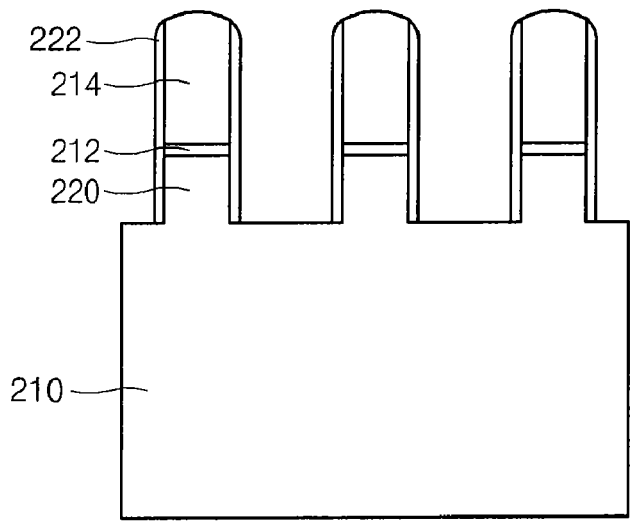
Figure 2B:
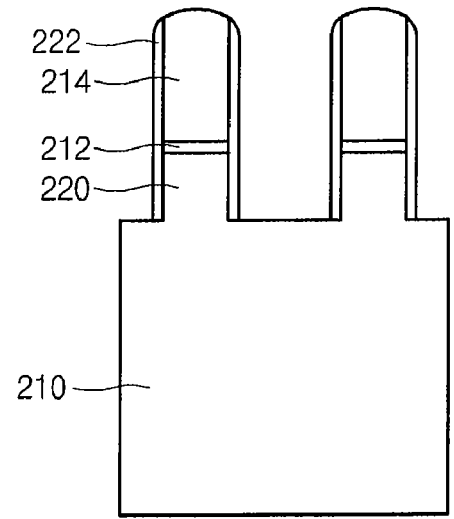

Referring to FIG. 2b, a first insulating film (not shown) is formed over semiconductor substrate 210, first vertical pillars 220, and mask pattern 214. First insulating film is dry-etched to form a spacer 222 over a sidewall of each first vertical pillar 220, pad insulating film 212, and mask pattern 214. First insulating film may be an oxide film, a nitride film, or a combination thereof. A thickness of spacer 222 may be adjusted in consideration of thicknesses of a gate insulating film and a plurality of surrounding gate electrodes to be formed.

Figure 2C:
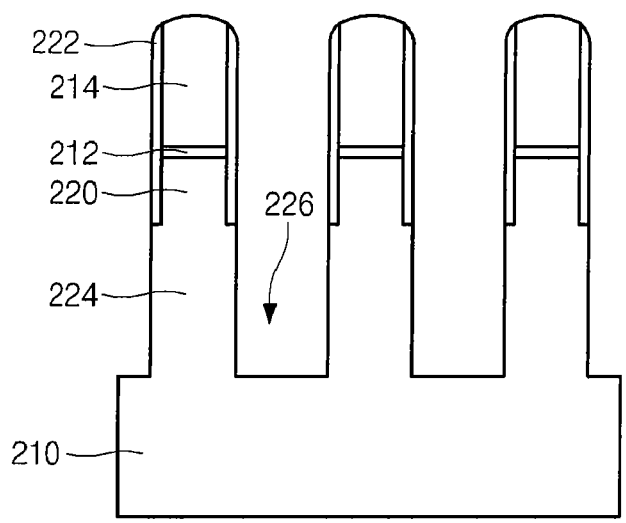
Figure 2C:
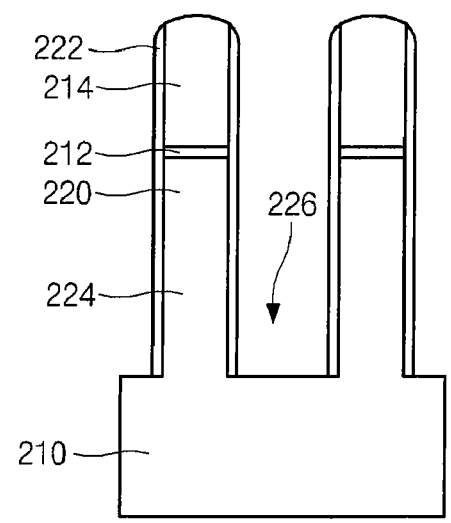

Referring to FIG. 2c, a portion of semiconductor substrate 210 exposed between first vertical pillars 220 is selectively etched using spacer 222 and mask pattern 214 as an etching mask to form a first recess 226 that exposes a second vertical pillar 224 extended below each first vertical pillar 220. In an embodiment of the present invention, the selective etching process for forming a plurality of second vertical pillars 224 comprises a dry etching process. A depth of each second vertical pillar 224 may be adjusted according to a size of the surrounding gate electrode to be formed.

Figure 2D:
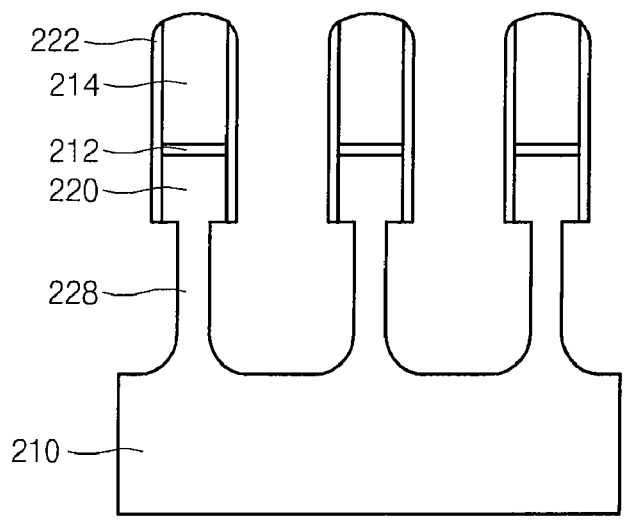
Figure 2D:
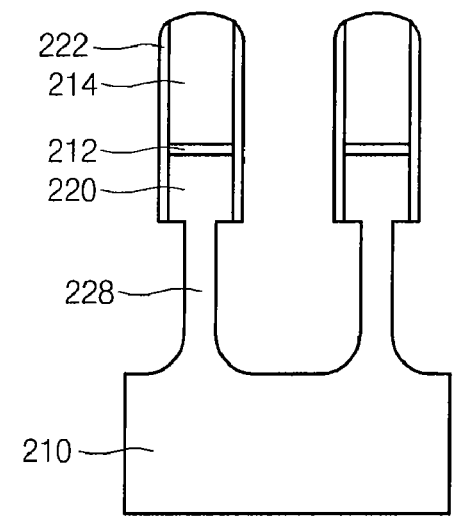

Referring to FIG. 2d, a portion of each second vertical pillar 224 exposed in first recess 226 is etched to form a plurality of third vertical pillars 228 each serving as a channel. A width of each third vertical pillar 228 is less than that of first vertical pillar 220.

Figure 2E:
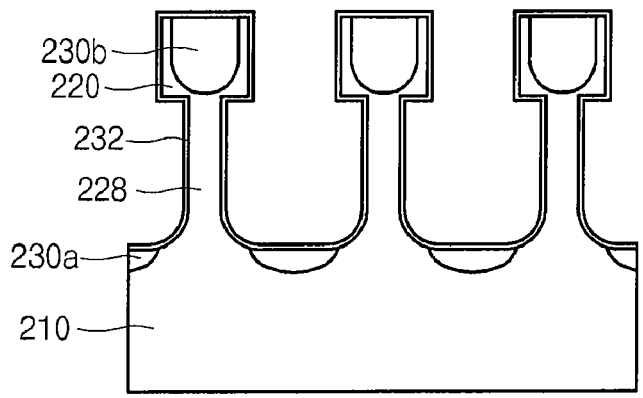
Figure 2E:
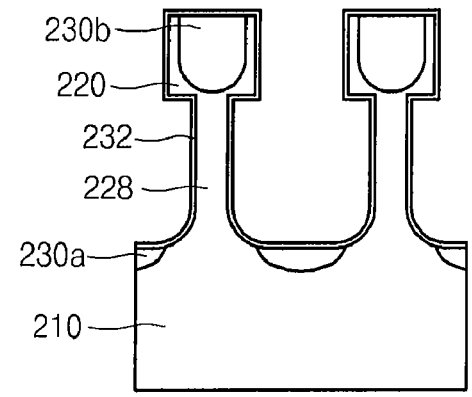

Referring to FIG. 2e, spacer 222, mask pattern 214, and pad insulating film 212 of FIG. 2d are removed to expose each first vertical pillar 220. Impurity ions are injected into an upper part of each first vertical pillar 220 and semiconductor substrate 210 between third vertical pillars 228 to simultaneously form source/drain regions 230a and 230b. A second insulating film 232, which serves as a gate insulating film, is formed over each first vertical pillar 220, each third vertical pillar 228, and semiconductor substrate 210 between third vertical pillars 228. Impurity ions for forming source/drain regions 230a and 230b comprise an n-type impurity ion. Second insulating film 232 comprises an oxide film.

Figure 2F:
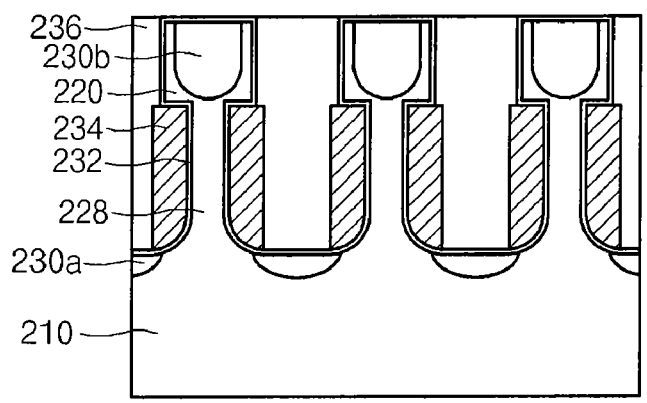
Figure 2F:
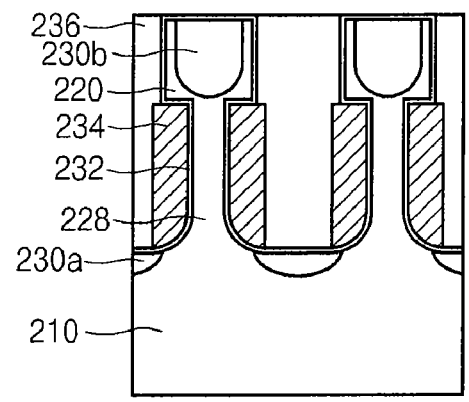

Referring to FIG. 2f, a first conductive layer (not shown) is formed over second insulating film 232 and each third vertical pillar 228 to fill a space between third vertical pillars 228. The first conductive layer is selectively etched using a mask that defines channel region 102 of FIG. 1, to form a surrounding gate 234 over an outside of each third vertical pillar 228. Third insulating film 236 is formed over semiconductor substrate 210, each surrounding gate 234, and each first vertical pillar 220.

The first conductive layer may be a polysilicon layer, a metal layer, or a combination thereof. The selective etching process for forming each surrounding gate 234 comprises an anisotropic etching process. Third insulating film 236 comprises a Chemical Vapor Deposition (CVD) oxide film. To simplify the process, third insulating film 236 comprises an oxide film having thermal liquidity. The oxide film may be a Spin-on-Dielectric (SOD) oxide film, a Spin- on-Glass (SOG) oxide film, a Boro-phospho-silicate Glass (BPSG) oxide film, or combinations thereof.

Figure 2G:
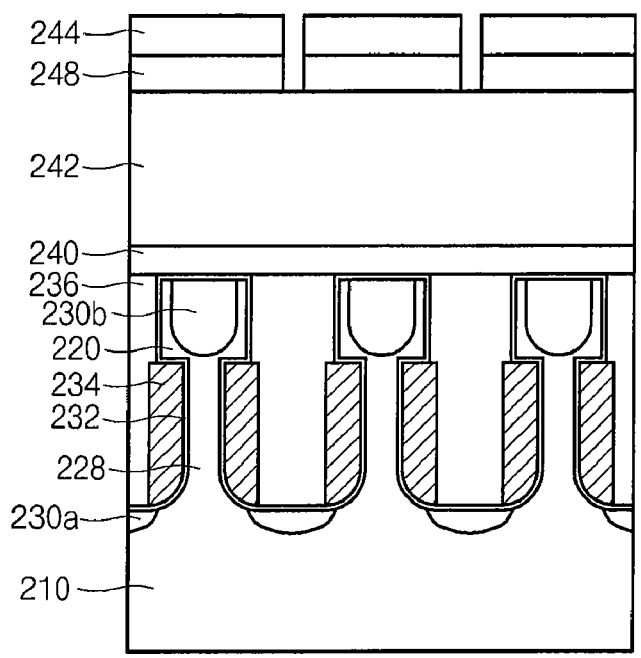
Figure 2G:
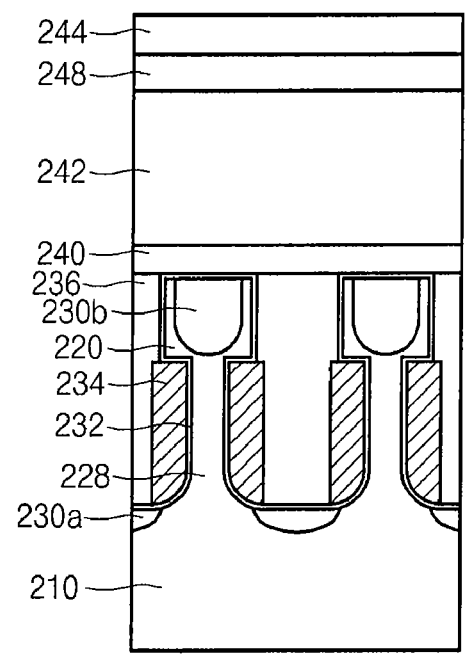
Figure 2H:
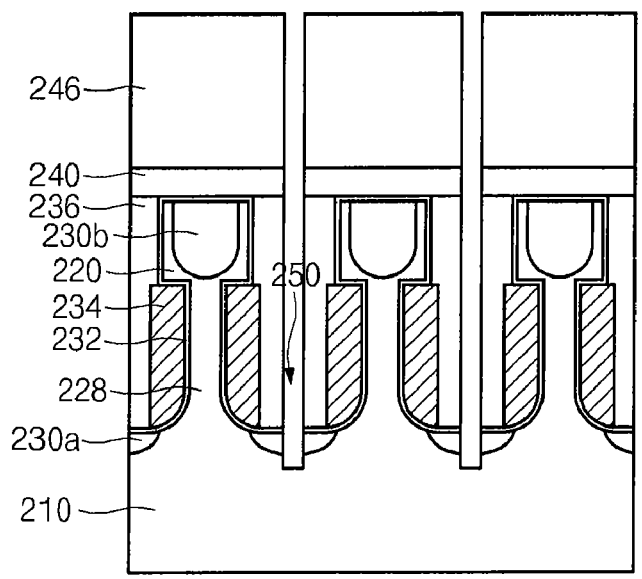
Figure 2H:
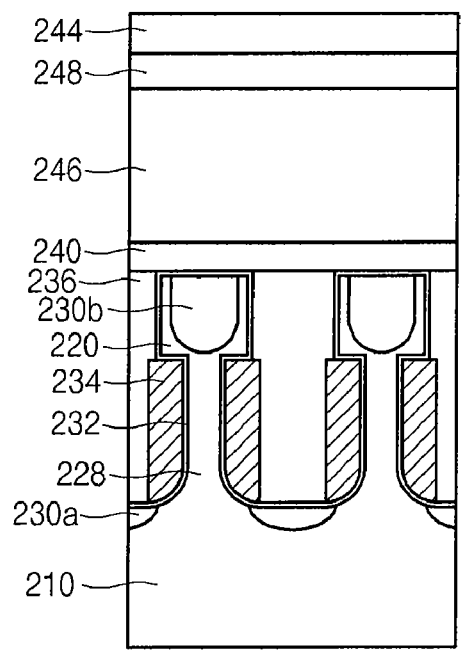

Referring to FIGS. 2g and 2h, a fourth insulating film 240 and a second mask layer 242 are formed over third insulating film 236 and each first vertical pillar 220. Fourth insulating film 240 comprises an oxide film. Second mask layer 242 comprises an amorphous carbon film. A first photoresist pattern 244 for separating bit lines from each other is formed over second mask layer 242. Second mask layer 242 is etched using first photoresist pattern 244 as an etching mask to form a second mask pattern 246.

First photoresist pattern is then removed. Fourth insulating film 240, third insulating film 236, and a portion of semiconductor substrate 210 including source/drain region 230a are etched to form a second recess 250 that separates bit lines from each other, each of which is defined as bit line region 106 of FIG. 1. A silicon oxynitride film 248 serving as a bottom anti-reflection coating may be further formed between second mask layer 242 and first photoresist pattern 244.

Figure 2I:
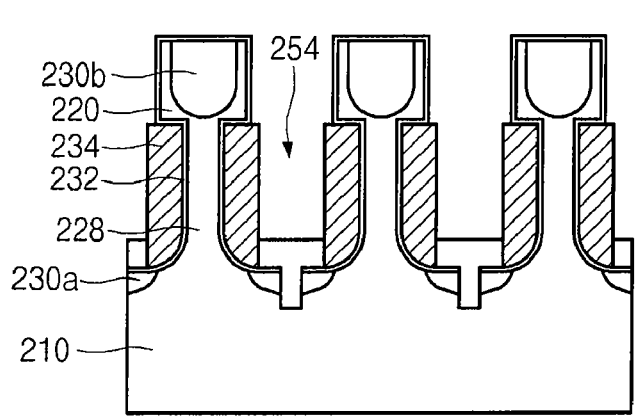
Figure 2I:
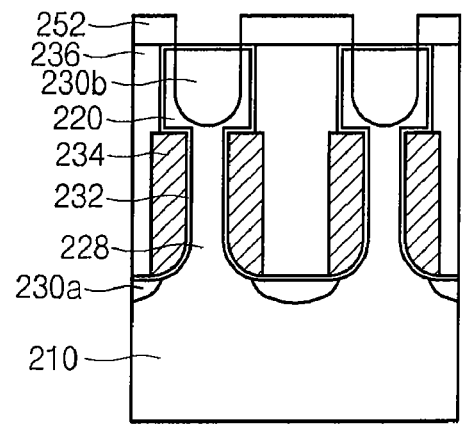

Referring to FIG. 2i, second mask pattern 246 and fourth insulating film 240 of FIG. 2h are removed to expose third insulating film 236. A thermal treatment process is performed on third insulating film 236 to fill second recess 250 of FIG. 2j. A second photoresist pattern 252 that exposes word line region 104 of FIG. 1 is formed over third insulating film 236 and first vertical pillar 220. A portion of third insulating film 236 is etched using second photoresist pattern 252 as an etching mask to form a third recess 254. Preferably, a bottom anti-reflection coating may be formed below second photoresist pattern 252.

Figure 2J:
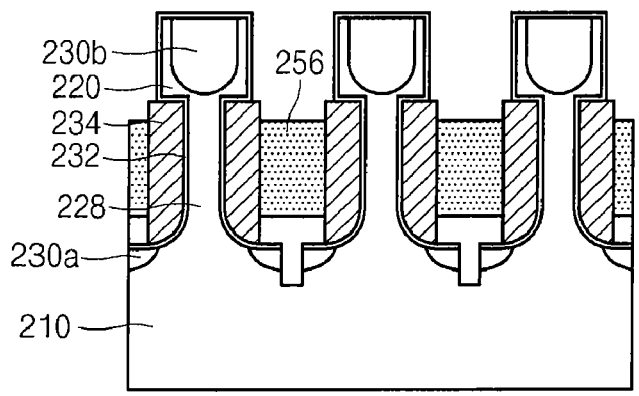
Figure 2J:
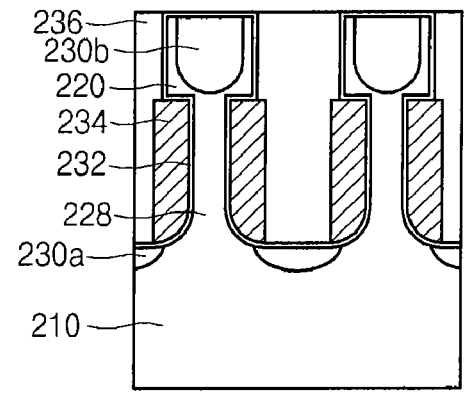

Referring to FIG. 2j, second photoresist pattern 252 of FIG. 2i is then removed. A second conductive layer (not shown) is formed for filling third recess 254. The second conductive layer comprises a stacked structure of a barrier metal layer and a metal layer. In addition, the second conductive layer may be a doped polysilicon layer, a titanium (Ti) layer, a tungsten (W) layer, a cobalt (Co) layer, a nickel (Ni) layer, a titanium nitride (TiN) film, a tantalum nitride (TaN) layer, a tungsten silicide ($WSi_x$) layer, a cobalt silicide ($CoSi_x$) layer, a nickel silicide ($NiSi_x$) layer, a titanium silicide ($TiSi_x$) layer, or combinations thereof. The second conductive layer is selectively etched to form a word line 256 that electrically connects surrounding gates 234. The selective etching process for forming word line 256 comprises an etch-back process.

Figure 2K:
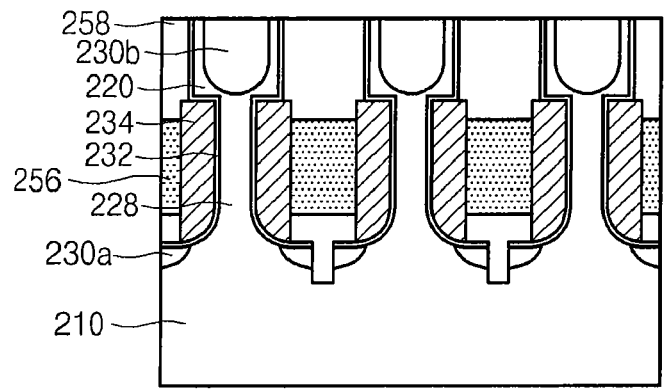
Figure 2K:
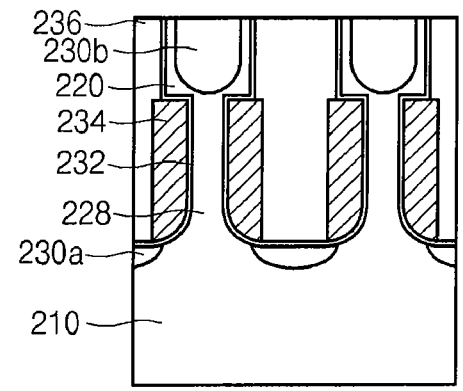
Figure 2L:
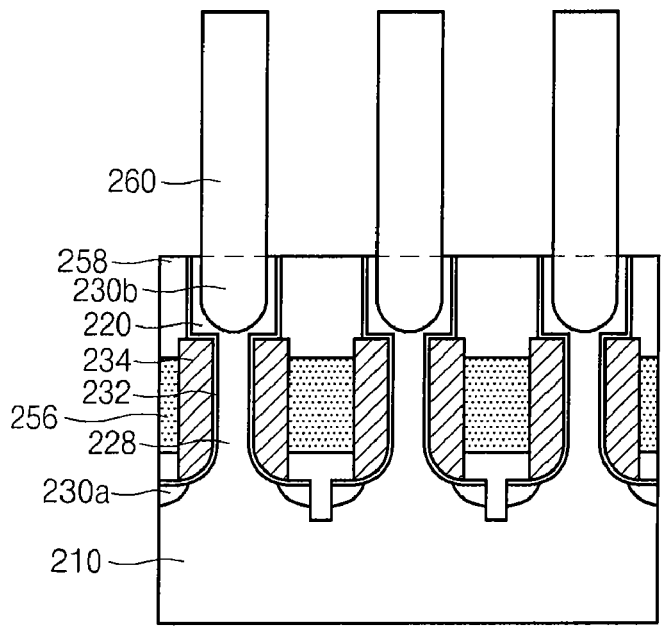
Figure 2L:
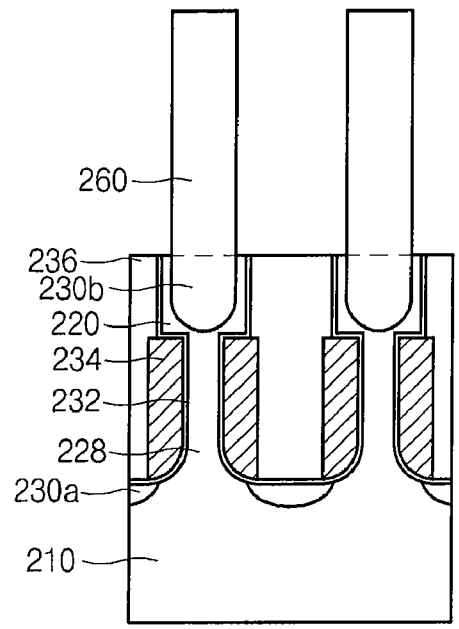
Figure 2M:
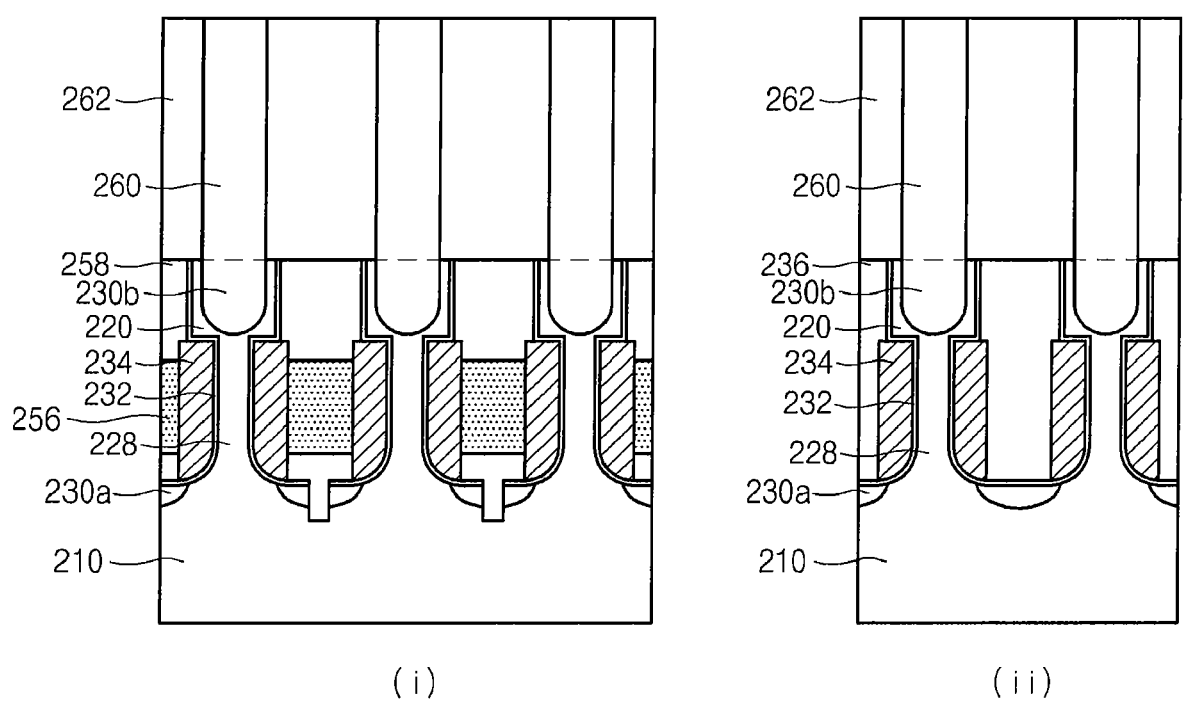

Referring to FIGS. 2k to 2m, a fifth insulating film 258 is formed over word line 256 and each first vertical pillar 220. Fifth insulating film 258 is planarized until source/drain region 230b over each first vertical pillar 220 is exposed. A storage node contact 260 is formed using source/drain region 230b as a seed layer. The process of forming storage node contact 260 comprises a selective epitaxial growth method. The planarizing process of fifth insulating film 258 comprises a chemical mechanical polishing (CMP) method or an etch-back method.

A sixth insulating film 262 is formed over fifth insulating film 258, third insulating film 236, and storage node contact 260. Fifth insulating film 258 and sixth insulating film 262 each comprise an oxide film. Sixth insulating film 262 is planarized until storage node contact 260 is exposed. The planarizing process of sixth insulating film 262 comprises a CMP method or an etch-back method. Subsequent processes are performed using well known processes including a process of forming a storage node, a process of forming a metal interconnect, and so on, to obtain a transistor.

As described above, according to an embodiment of the present invention, after reducing a high aspect ratio of devices, an etching process for separating bit lines and a process of forming an insulating film for bit line separation are performed, thereby maximizing the yield of devices. In addition, a source/drain region is formed before forming a gate electrode to increase the degree of overlap, thereby improving a floating body effect. As a result, the leakage current can be reduced to improve the refresh characteristic of devices. Further, the insulating film having thermal liquidity is utilized during the etching process for bit line separation to omit the insulating film in a subsequent process. The source/ drain region is formed by only one impurity implanting process, thereby simplifying the process.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A method of fabricating a semiconductor device, the method comprising:
   forming a mask pattern over a semiconductor substrate to define a channel region;
   etching a portion of the semiconductor substrate using the mask pattern as an etching mask to form a first pillar;
   forming a spacer over a sidewall of the mask pattern and the first pillar;
   etching a portion of the semiconductor substrate exposed between the first pillar and an adjacent first pillar using the spacer and the mask pattern as an etching mask to form a second pillar elongated from the first pillar;
   selectively etching a portion of the second pillar to form a third pillar;
   removing the spacer and the mask pattern;
   implanting an impurity into an upper part of the first pillar and the semiconductor substrate between the third pillar and an adjacent third pillar to form a source/drain region;
   forming a surrounding gate over an outside of the third pillar;
   forming a first insulating film over the semiconductor substrate the surrounding gate and the first pillar;
   selectively etching the first insulating film and a portion of the semiconductor substrate between the surrounding gate to form a recess for bit line isolation;
   subjecting the first insulating film to a reflow process to fill the recess;
   etching a portion of the first insulating film using a mask defining a word line;
   forming the word line to electrically connect with the surrounding gate;
   forming a second insulating film over the word line;
   polishing the second insulating film until a top surface of the first pillar is exposed;
   forming a storage node contact by selectively epitaxial-growing the exposed top surface of the first pillar as a seed layer; and
   forming a third insulating film over the second insulating film and the storage node contact.

2. The method of claim 1, wherein the mask pattern comprises a silicon nitride film.

3. The method of claim 1, wherein a top surface of the mask pattern is circular or polygonal.

4. The method of claim 1, wherein the spacer comprises a silicon nitride film.

5. The method of claim 1, wherein the etching process for forming the second pillar is performed by an anisotropic etching method.

6. method of claim 1, wherein the etching process for forming the third pillar is performed by an isotropic etching method.

7. The method of claim 1, wherein the first insulating film comprises an oxide film having a thermal liquidity.

8. The method of claim 7, wherein the oxide film is selected from the group consisting of a Spin-on-dielectric (SOD) material, a Spin-on-glass (SOG) material, a Boro-phosphosilicate glass (BPSG) material, and combinations thereof.

9. The method of claim 1, wherein the process of forming the word line comprises:
   forming a conductive layer over the first insulating film, the surrounding gate, and the first pillar; and
   selectively etching the conductive layer to electrically connect with the surrounding gate.

10. The method of claim 9, wherein a process of selectively etching the conductive layer is performed by an etch-back method.

11. The method of claim 9, wherein the conductive layer comprises a stacked structure of a barrier metal layer and a metal layer.

12. A semiconductor device comprising a vertical transistor fabricated by the method of claim 1.

13. A method of fabricating a semiconductor device, the method comprising:
   forming a plurality of pillars over a semiconductor substrate;
   forming a plurality of surrounding gates, wherein each surrounding gate is formed at a lower part of one of the pillars;
   depositing an insulating film between the pillars;
   forming a recess by selectively etching the insulating film and a portion of the semiconductor substrate between the surrounding gates;
   subjecting the insulating film to a reflow process to fill the recess; and
   forming a word line to electrically connect with the surrounding gates.

14. The method of claim 13, wherein each pillar includes an upper part which is wider than the lower part, the upper part of each pillar being coupled to a storage node contact.

15. The method of claim 14, wherein forming-a-plurality-of-pillars comprises:
   forming a mask pattern over the semiconductor substrate to define a channel region;
   etching a portion of the semiconductor substrate using the mask pattern as an etch mask to form the pillars;
   forming a spacer over a sidewall of the mask pattern and the pillars;
   etching a portion of the semiconductor substrate exposed between the pillars using the spacer and the mask pattern as an etch mask to elongate the pillars;
   selectively etching the lower part of each pillar; and
   removing the spacer and the mask pattern.

16. The method of claim 13, further comprising:
   forming a source/drain region by implanting an impurity into an upper part of each pillar and the semiconductor substrate between the pillars.

17. The method of claim 13, wherein forming-a-word-line comprises:
   etching a portion of the insulating film using a mask defining a word line;
   forming a conductive layer over the insulating film, each surrounding gate, and each pillar; and
   selectively etching the conductive layer.

18. The method of claim 13, further comprising:
   forming a second insulating film over the word line; and
   polishing the second insulating film until a top surface of each of the plurality of pillars is exposed.

* * * * *